(12) United States Patent
Hu

(10) Patent No.: US 8,770,681 B2
(45) Date of Patent: Jul. 8, 2014

(54) RACK WITH LOCKABLE TRAY

(71) Applicants: Hong Fu Jin Precision Industry (ShenZhen) Co., Ltd., Shenzhen (CN); Hon Hai Precision Industry Co., Ltd., New Taipei (TW)

(72) Inventor: Xiu-Quan Hu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/671,517

(22) Filed: Nov. 7, 2012

(65) Prior Publication Data
US 2013/0278124 A1   Oct. 24, 2013

(30) Foreign Application Priority Data

Apr. 23, 2012   (CN) .......................... 2012 1 0119826

(51) Int. Cl.
*A47B 97/00*   (2006.01)
*H05K 7/14*   (2006.01)

(52) U.S. Cl.
USPC .................................. 312/223.2; 361/679.39

(58) Field of Classification Search
CPC ........................................................ G06F 1/187
USPC ........ 312/330.1, 319.1, 334.1, 334.7, 334.44, 312/334.46, 223.1, 223.2; 211/26; 248/221.11, 222.11, 222.12; 361/679.02, 679.33, 679.43, 679.58, 361/726, 727, 679.39

See application file for complete search history.

(56) References Cited

U.S. PATENT DOCUMENTS

| | | | |
|---|---|---|---|
| 5,599,080 A * | 2/1997 | Ho | 312/334.7 |
| 6,238,031 B1 * | 5/2001 | Weng | 312/333 |
| 6,373,707 B1 * | 4/2002 | Hutchins | 361/725 |
| 7,206,200 B2 * | 4/2007 | Chung | 361/679.39 |
| 7,703,734 B2 * | 4/2010 | Chen et al. | 248/298.1 |
| 8,498,106 B2 * | 7/2013 | Peng et al. | 361/679.33 |
| 2003/0112596 A1 * | 6/2003 | Shih | 361/685 |
| 2003/0184964 A1 * | 10/2003 | Neukam et al. | 361/685 |
| 2003/0222550 A1 * | 12/2003 | Boswell et al. | 312/223.2 |
| 2004/0070930 A1 * | 4/2004 | Scherer et al. | 361/685 |
| 2004/0075978 A1 * | 4/2004 | Chen et al. | 361/685 |
| 2005/0141189 A1 * | 6/2005 | Chen et al. | 361/685 |
| 2007/0035920 A1 * | 2/2007 | Peng et al. | 361/685 |

* cited by examiner

*Primary Examiner* — James O Hansen
(74) *Attorney, Agent, or Firm* — Novak Druce Connolly Bove + Quigg LLP

(57) ABSTRACT

A rack includes an enclosure, a tray and a locking member. The enclosure defines a receiving space. The enclosure includes a side wall. The side wall includes a rail. A locking slot is defined in the side wall. The tray is received in the receiving space and is slidable on the rail. The tray includes a side plate. An operating hole is defined in the side plate. The locking member includes a first end, a second end opposite to the first end, and a locking portion located on the second end. The first end is attached to an inner surface of the side plate. The locking portion is engaged with the locking slot.

8 Claims, 6 Drawing Sheets

RACK WITH LOCKABLE TRAY

BACKGROUND

The present disclosure relates to racks, especially to a computer rack with a lockable tray.

DESCRIPTION OF RELATED ART

Computer network systems include many separate computer units or servers which are positioned and stacked relative to each other in a rack. The rack includes a plurality of trays, where each computer unit or server is secured to one tray. The tray can be pulled away from the front of the rack so that each separate computer unit or server can be serviced by technicians for various reasons, such as maintenance, replacement of computer cards, for example, while the server is still in operation. The tray is secured on the rack via screws before being removed. When the tray is pulled away from the rack, the screws need to be detached first, and the tray may fall out of the rack without being blocked.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
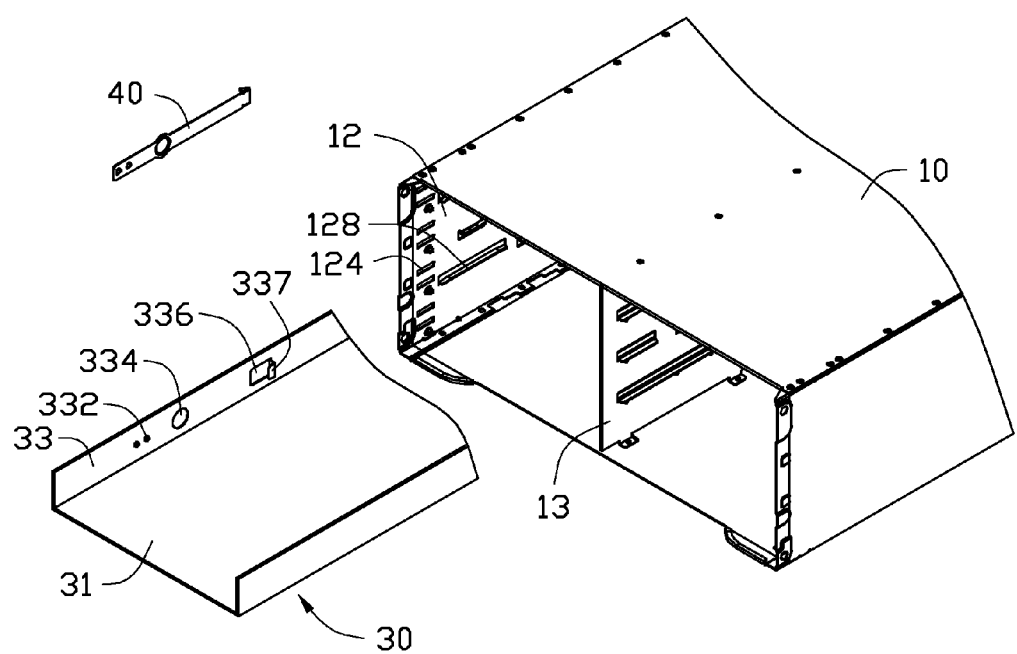
FIG. 1 is an exploded, isometric view of a computer rack in one embodiment.

FIG. 1 is one embodiment of a computer rack. The computer rack includes an enclosure 10 and a tray assembly. The tray assembly includes a tray 30 and a locking member 40 located on the tray 30.

The enclosure 10 includes a top wall, a bottom wall, and two parallel side walls 12, 13. The top wall, the bottom wall and two side walls defines a receiving space for receiving the tray assembly. Two parallel locking slots 124 are defined in the side wall 12. A guiding rail 128 extrudes from an inner surface of the side wall 12. The extension direction of the guiding rail 128 is substantially parallel to each locking slot 124.

The tray 30 includes a bottom plate 31 and two side plates 33 extending from opposite sides of the bottom plate 31. An operating hole 334 and a locking hole 336 are defined in one of two side plates 33. Two posts 332 protrude from an inner surface of the side plate 33. The operating hole 334 may be a circle. The locking hole 336 may be rectangular. A block 337 is located on the side plate 33 adjacent to the locking hole 336. A cross section of the block 337 is substantially L-shaped.

Figure 2:
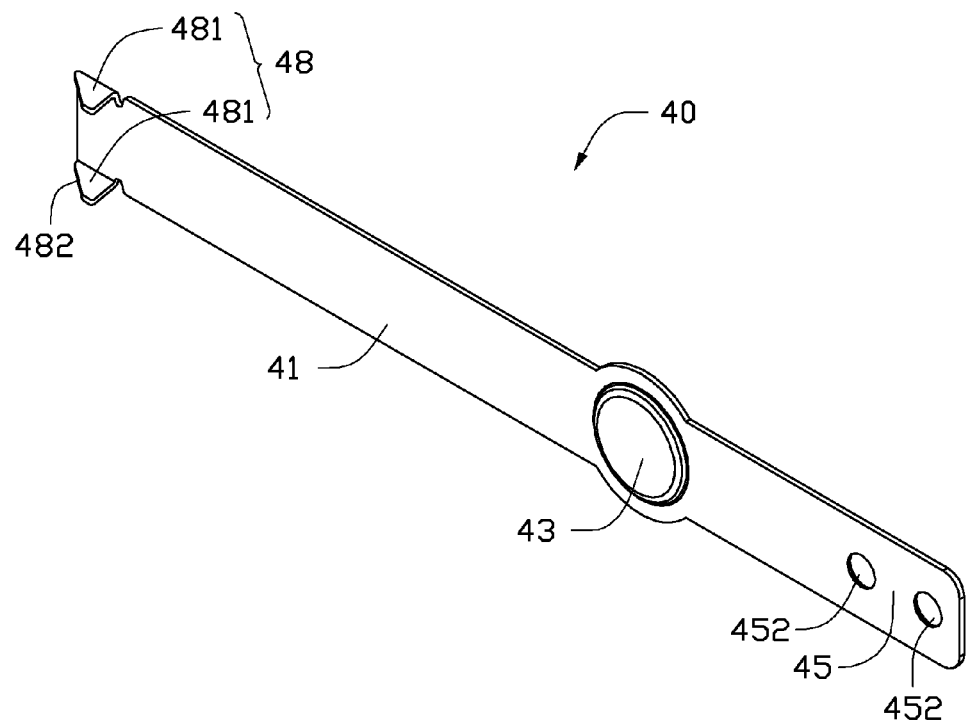
FIG. 2 is isometric view of a locking member of the computer rack of FIG. 1.
Figure 3:
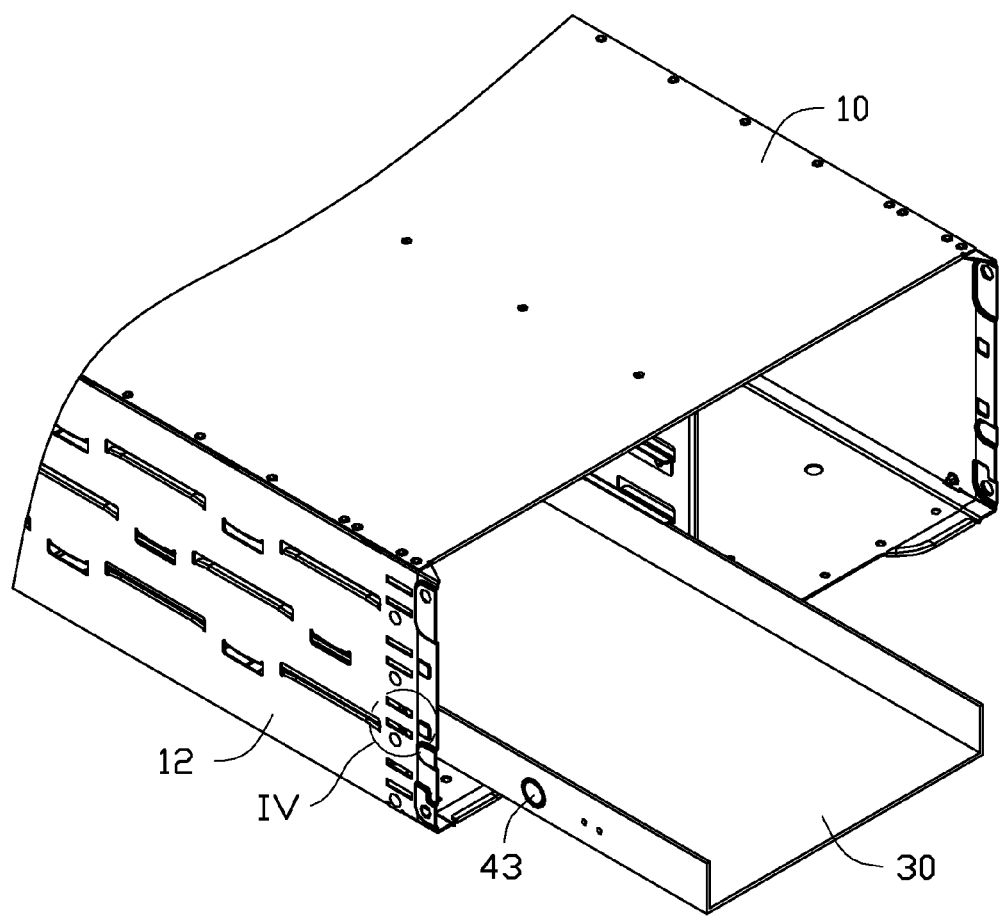
FIG. 3 is an assembly view of the computer rack of FIG. 1, but shown from another aspect.
Figure 4:
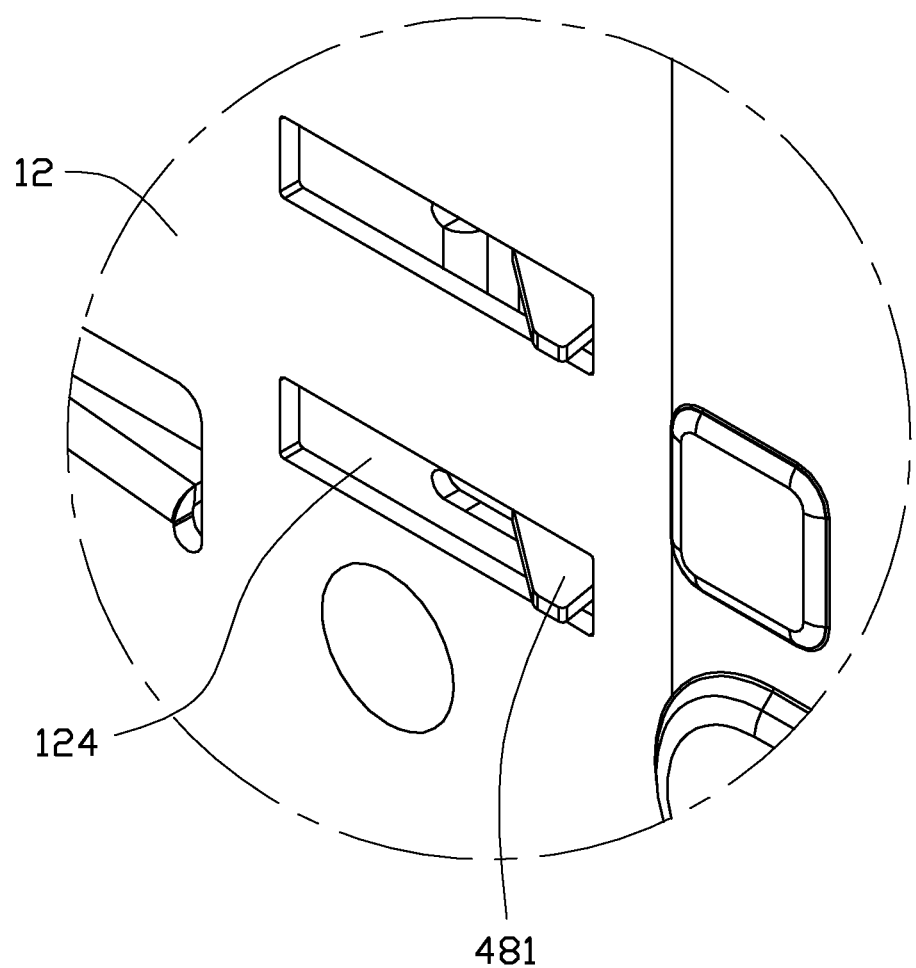
FIG. 4 is an enlarged view of a circled portion IV of FIG. 3.

FIG. 2 shows the locking member 40 of the embodiment. The locking member 40 includes a body 41, an operating portion 43 located on the body 41, a fixing portion 45 and a locking portion 48. The body 41 is resilient and is substantially an elongate strip. The operating portion 43 is located on substantially a middle portion of the body 41. A width of the operating portion 43 may be larger than that of the body 41. The operating portion 43 is circled and slightly protrudes from a surface of the body 41. The fixing portion 45 and the locking portion 48 are located on opposite ends of the body 41. Two fixing holes 452 are defined in the fixing portion 45 aligned along an extension direction of the body 41. The locking portion 48 includes two locking tabs 481. The two locking tabs 481 are parallel to each other. Each of the two locking tabs 481 is substantially a triangle. Each of the two locking tabs 481 includes a slanted guiding flange 482.

Figure 5:
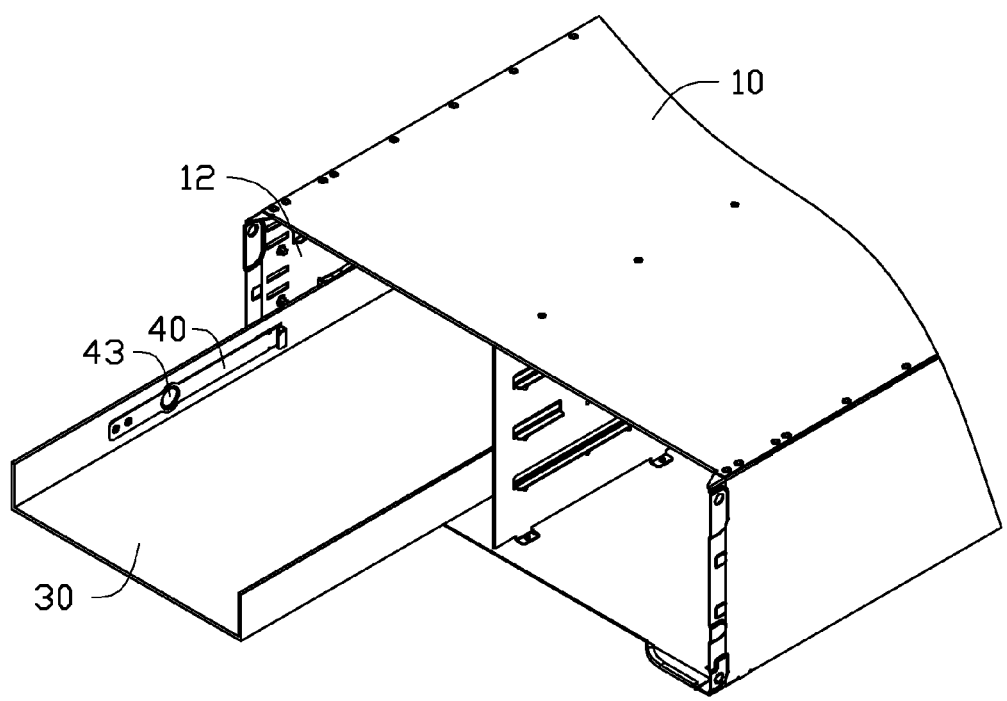
FIG. 5 is an assembly view of the computer rack of FIG. 1.
Figure 6:
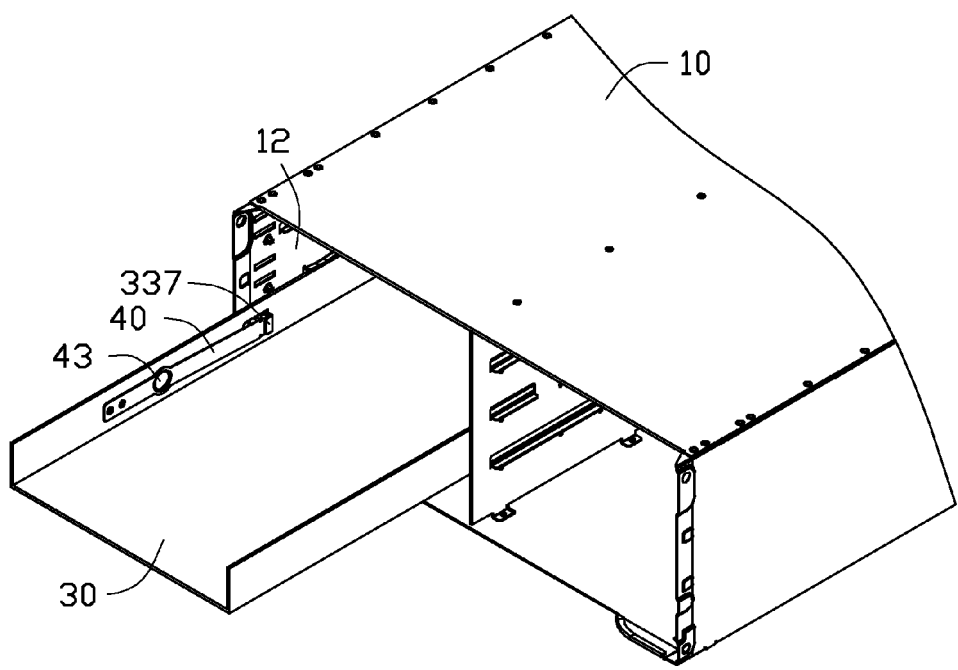
FIG. 6 is similar to FIG. 5, but the locking member is in a deformed state.

FIG. 5 shows that in assembling of the tray, the locking member 40 is fixed to the inner surface of the side plate 33 of the tray 30. The two posts 332 extend through the two fixing holes 452 of the locking member 40. The locking member 40 can be rivet by the posts 332. Therefore, the opposite end of the locking member 40 can swing along a direction substantially perpendicular to the side plate 33. In an original state, the locking portion 48 extends through the locking hole 336 of the tray 30. The operating portion 43 is accessible through the operating hole 334 from an outer surface of the side plate 33.

FIG. 3 to FIG. 6 show that when assembling the tray assembly into the enclosure 10, the tray 30 is moved into the receiving space of the enclosure 10. The tray 30 is guided onto the guiding rail 128 of the side wall 12. The guiding flanges 482 abut a front edge of the side wall 12, and the locking portion 48 deforms away from the side plate 33 until the locking portion 48 reaches the locking slots 124. The locking portion 48 engages with the corresponding locking slots 124, and the body 41 deforms back to the original state. The tray 30 is further moved into the receiving space, and the locking portion 48 is deformed.

When moving the tray 30 from the enclosure 10, the tray 30 is drawn manually out of the enclosure 10. The locking portion 48 deforms to the original state and engages with the locking slots 124 when the locking portion 48 reaches the locking slots 124. The locking portion 48 prevents the tray 30 from moving out of the enclosure 10. When removing the tray 30, the operating portion 43 is pressed in through the operating hole 334. The locking portion 48 deforms away from the side plate 33. The locking portion 48 is disengaged from the locking slots 124. The tray 30 can be totally removed from the enclosure 10.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A rack, comprising:
   an enclosure, defining a receiving space, comprising a side wall, the side wall comprising a rail, and a locking slot defined in the side wall;

a tray, received in the receiving space and slidable on the rail, comprising a side plate, and an operating hole is defined in the side plate; and a locking member comprising a first end, a second end opposite to the first end, and a locking portion located on the second end, the first end is attached to an inner surface of the side plate, and the locking portion is engaged with the locking slot, wherein the locking member is configured to being pressed through the operating hole from an outer surface of the side plate, to deflect the second end of the locking member, and disengage the locking portion from the locking slot, a locking hole is defined in the side plate, and the locking portion extends through the locking hole when the locking portion is engaged with the locking slot.

2. The rack of claim 1, wherein the locking portion comprises two locking tabs, and the two locking tabs are parallel to each other.

3. The rack of claim 2, wherein each of the two locking tabs comprises a slanted guiding flange.

4. The rack of claim 3, wherein each of the two locking tabs is substantially triangular.

5. The rack of claim 1, wherein the locking member comprises a body, and the body is resilient and substantially an elongated strip.

6. The rack of claim 5, wherein the locking member comprises an operating portion corresponding to the operating hole, and a width of the operating portion is larger than that of the body.

7. The rack of claim 6, wherein the operating portion is located at a substantially middle portion of the body.

8. The rack of claim 1, wherein the tray comprises a block, located on the side plate adjacent the locking hole, for blocking the second end of the locking member, and a cross section of the block is substantially L-shaped.

* * * * *